United States Patent
Yabuta et al.

(10) Patent No.: US 8,704,429 B2
(45) Date of Patent: Apr. 22, 2014

(54) BISMUTH IRON OXIDE POWDER, MANUFACTURING METHOD FOR THE BISMUTH IRON OXIDE POWDER, DIELECTRIC CERAMICS, PIEZOELECTRIC ELEMENT, LIQUID DISCHARGE HEAD, AND ULTRASONIC MOTOR

(75) Inventors: Hisato Yabuta, Machida (JP); Makoto Kubota, Yokohama (JP); Mikio Shimada, Kawasaki (JP); Kenji Takashima, Saitama (JP); Fumio Uchida, Daito (JP); Kenji Maeda, Hirakata (JP); Chiemi Shimizu, Hirakata (JP)

(73) Assignees: Canon Kabushiki Kaisha, Tokyo (JP); Fuji Chemical Co., Ltd., Osaka-shi (JP)

( * ) Notice: Subject to any disclaimer, the term of this patent is extended or adjusted under 35 U.S.C. 154(b) by 0 days.

(21) Appl. No.: 13/045,118

(22) Filed: Mar. 10, 2011

(65) Prior Publication Data

US 2011/0221302 A1    Sep. 15, 2011

(30) Foreign Application Priority Data

Mar. 15, 2010   (JP) .................................. 2010-058372
Mar. 8, 2011   (JP) .................................. 2011-050307

(51) Int. Cl.
*H01L 41/187*   (2006.01)

(52) U.S. Cl.
USPC .................... 310/358; 310/311; 252/62.9 PZ; 252/62.9 R (58) Field of Classification Search
USPC .......................... 310/357–359, 311; 501/134; 252/62.9 R, 62.9 PZ
IPC .................................................... H01L 41/187
See application file for complete search history.

(56) References Cited

U.S. PATENT DOCUMENTS

| | | | |
|---|---|---|---|
| 7,586,234 B2 * | 9/2009 | Miyazawa et al. | 310/311 |
| 7,931,821 B2 * | 4/2011 | Saito et al. | 252/62.9 R |
| 2010/0025617 A1 | 2/2010 | Kubota et al. | |

(Continued)

FOREIGN PATENT DOCUMENTS

| | | |
|---|---|---|
| CN | 101279841 A | 10/2008 |
| JP | 2007-221066 A | 8/2007 |

(Continued)

OTHER PUBLICATIONS

Sushmita Ghosh [ low-Temperature synthesis of Nanosized Bismuth Ferrite by Soft Chemial Route;Communications of the American Ceramic Society vol. 88,No. 5 Apr. 14, 2005 ].*

(Continued)

*Primary Examiner* — Thomas Dougherty
*Assistant Examiner* — Karen B Addison
(74) *Attorney, Agent, or Firm* — Fitzpatrick, Cella, Harper & Scinto (57) ABSTRACT

Provided is a lead-free dielectric ceramics having a low leakage current value, and a bismuth iron oxide powder as a raw material thereof. The bismuth iron oxide powder includes at least: (A) grains including a bismuth iron oxide having a perovskite-type crystal structure; (B) grains including a bismuth iron oxide having a crystal structure classified to a space group Pbam; and (C) grains including a bismuth iron oxide or a bismuth oxide having a crystal structure that is classified to a space group I23. The dielectric ceramics are made of bismuth iron oxide in which the bismuth iron oxide crystals having the crystal structure classified to the space group Pbam are distributed at a grain boundary of crystal grains of the bismuth iron oxide crystals having the perovskite-type crystal structure.

7 Claims, 5 Drawing Sheets

(56) References Cited

U.S. PATENT DOCUMENTS

| | | | |
|---|---|---|---|
| 2010/0155646 A1 | 6/2010 | Furuta et al. | |
| 2010/0208412 A1 | 8/2010 | Takashima et al. | |

FOREIGN PATENT DOCUMENTS

| | | | |
|---|---|---|---|
| JP | 2007-287739 | A | 11/2007 |
| JP | 2009-231482 | A | 10/2009 |
| WO | 2010/114148 | A1 | 10/2010 |

OTHER PUBLICATIONS

Custau Catalan[ Physic and application of Bismuth Ferrite; Advanced Materials vol. 21,issue 24 2009 pp. 2463-2486].*

Jian-Tao Han et al., "Tunable Synthesis of Bismuth Ferrites with Various Morphologies," 18 Adv. Mater. 2145-2148 (Jul. 2006).

Office Action in Chinese Application No. 201110064029.2 (Nov. 15, 2012).

* cited by examiner

BISMUTH IRON OXIDE POWDER, MANUFACTURING METHOD FOR THE BISMUTH IRON OXIDE POWDER, DIELECTRIC CERAMICS, PIEZOELECTRIC ELEMENT, LIQUID DISCHARGE HEAD, AND ULTRASONIC MOTOR

CROSS-REFERENCE TO RELATED APPLICATIONS

This application claims the benefit of Japanese Patent Application No. 2010-058372, filed Mar. 15, 2010, and Japanese Patent Application No. 2011-050307, filed Mar. 8, 2011, which are hereby incorporated by reference herein in their entirety.

BACKGROUND OF THE INVENTION

1. Field of the Invention

The present invention relates to a bismuth iron oxide powder and a manufacturing method for the bismuth iron oxide powder. In particular, the present invention relates to a nanograin bismuth iron oxide powder to be raw material of a dielectric ceramics and a manufacturing method for the nanograin bismuth iron oxide powder. The present invention also relates to a dielectric ceramics, and more particularly, to a dielectric ceramics containing $BiFeO_3$ as a main component. The present invention also relates to a piezoelectric element using the dielectric ceramics, and a liquid discharge head and an ultrasonic motor which use the piezoelectric element.

2. Description of the Related Art

In the conventional electric and electronic industries, ceramics materials containing lead are widely used. A typical material thereof is $Pb(Zr, Ti)O_3$ (hereinafter, referred to as "PZT"), or lead-containing relaxor materials such as $Pb(Mg, Nb)O_3$. Each of them has a perovskite-type crystal structure, and lead (Pb) occupies the A-site of the crystal. The PZT ceramics has high piezoelectric performance, and hence the PZT ceramics is used as a piezoelectric element of an actuator or the like. In addition, a ceramics of the lead-containing relaxor material has a high dielectric constant and can be combined with a ferroelectric material such as $PbTiO_3$ so as to obtain good temperature characteristics, therefore, the ceramics is used for an element such as a stack ceramics capacitor. The piezoelectric element and the capacitor use the dielectric ceramics, particularly the ferroelectric ceramics as a main component of the element, and the piezoelectric element and the capacitor are both classified to a dielectric element.

In this way, a ceramics containing lead can provide a high performance dielectric element. However, there is concern about bad influence to environment when the ceramics is produced and when it is scrapped. Therefore, it is requested to provide a dielectric ceramics having high performance without lead.

As a candidate of dielectric ceramics materials that do not contain lead, a material having a perovskite-type crystal structure whose the A-site is occupied by bismuth (Bi) is noted. The lead element has an outermost electron structure of $6s^26p^2$, which becomes +2 valent if the A-site of the perovskite structure is occupied. Therefore, two of outermost electrons exist as a lone pair in lead ion at the A-site. The bismuth element has an outermost electron structure of $6s^26p^3$, which becomes +3 valent if the A-site of the perovskite structure is occupied. Therefore, two of outermost electrons exist as a lone pair in bismuth ion of at A-site. In this way, the electron structure of the bismuth ion in the bismuth perovskite is similar to that of the lead ion in the lead perovskite, and hence similar characteristics can be expected. In particular, $BiFeO_3$ and a solid solution and a compound using the same are considered to be a promising candidate for lead-free dielectric ceramics materials.

For instance, Japanese Patent Application Laid-Open No. 2007-287739 discloses $Bi_{1-x}La_xFeO_3$ as a piezoelectric material containing $BiFeO_3$ as a main component. However, it is generally known that $BiFeO_3$ and the material containing $BiFeO_3$ as a main component have a large value of current (leakage current) when a voltage is applied, and hence $BiFeO_3$ and the material containing $BiFeO_3$ as a main component are not suitable as a dielectric material.

As one of methods of reducing a leakage current value of $BiFeO_3$, Japanese Patent Application Laid-Open No. 2007-221066 discloses a method of substituting a part of Fe in a $BiFeO_3$ film with manganese (Mn). Thus, a reduction of the leakage current value of the $BiFeO_3$ film can be realized. However, there is no description about a reduction of the leakage current in a bulk $BiFeO_3$ ceramics by adding Mn, and the effect in the bulk ceramics is not disclosed.

SUMMARY OF THE INVENTION

The present invention has been made to cope with such a problem, and an object thereof is to provide a lead-free dielectric ceramics having a low leakage current value, a bismuth iron oxide powder as a raw material thereof, and a manufacturing method for the bismuth iron oxide powder. Another object of the present invention is to provide a piezoelectric element, a liquid discharge head, and an ultrasonic motor which use the dielectric ceramics.

A bismuth iron oxide powder of the present invention which is a raw material of a dielectric ceramics that solves the above-mentioned problems includes at least: (A) grains composed of bismuth, iron, and oxygen including a bismuth iron oxide having a perovskite-type crystal structure; (B) grains composed of bismuth, iron, and oxygen including a bismuth iron oxide having a crystal structure classified to a space group Pbam; and (C) grains composed of bismuth and oxygen including a bismuth oxide or composed of bismuth, iron, and oxygen including a bismuth iron oxide having a crystal structure that is classified to a space group I23.

A manufacturing method for a bismuth iron oxide powder which is a raw material of a dielectric ceramics that solves the above-mentioned problems includes: adding ammonium hydrogen carbonate and ammonia water to a solution in which iron nitrate and bismuth nitrate are dissolved in a nitric acid solution, so as to obtain a bismuth iron composite oxide; agglomerating the bismuth iron composite oxide using a nonionic polymer flocculant so as to obtain an aggregate; and calcining the aggregate at a temperature of 400 degrees centigrade or higher and 650 degrees centigrade or lower.

A dielectric ceramics that solves the above-mentioned problems includes bismuth iron oxide crystals having a crystal structure classified to a space group Pbam and bismuth iron oxide crystals having a perovskite-type crystal structure, which are made of bismuth iron oxide, in which the bismuth iron oxide crystals having the crystal structure classified to the space group Pbam are distributed at a grain boundary of crystal grains of the bismuth iron oxide crystals having the perovskite-type crystal structure.

A piezoelectric element that solves the above-mentioned problems includes at least a pair of electrodes and the above-mentioned dielectric ceramics. A liquid discharge head that solves the above-mentioned problems includes the above-mentioned piezoelectric element.

An ultrasonic motor that solves the above-mentioned problems includes the above-mentioned piezoelectric element.

According to the present invention, the lead-free dielectric ceramics having a low leakage current value, and the bismuth iron oxide powder as a raw material thereof can be provided. Further, the piezoelectric element, the liquid discharge head, and the ultrasonic motor which use the dielectric ceramics can also be provided.

Further features of the present invention will become apparent from the following description of exemplary embodiments with reference to the attached drawings.

DESCRIPTION OF THE EMBODIMENTS

Hereinafter, an embodiment of the present invention is described.

First, a bismuth iron oxide powder of the present invention is described. The bismuth iron oxide powder according to the present invention contains at least (A) grains including a bismuth iron oxide having a perovskite-type crystal structure, (B) grains including a bismuth iron oxide having a crystal structure that is classified to a space group Pbam, and (C) grains including a bismuth iron oxide or a bismuth oxide having a crystal structure that is classified to a space group I23, which are made of bismuth iron oxide.

The bismuth iron oxide powder of the present invention (hereinafter may be abbreviated to "powder of the present invention") can be used as a raw material of a dielectric ceramics. The powder of the present invention contains at least bismuth, iron, and oxygen as constituent elements. Other element may be contained as the constituent element in the same or less amount than bismuth, iron, or oxygen. It is desired that the amount of the element other than bismuth, iron, and oxygen be as little as impurities, which is approximately 5% or smaller in terms of atomic ratio to bismuth, and is approximately 5% or smaller in terms of atomic ratio to iron. In the powder of the present invention, at least (A) grains having a perovskite-type crystal structure (grains (A)), (B) grains having a crystal structure that is classified to a space group Pbam (grains (B)), (C) grains having a crystal structure that is classified to a space group I23 (grains (C)) are contained, and the grains (A) are the main component.

The "ceramics" in the present invention means an aggregate (referred to also as a bulk) of crystal grains that contain metal oxide as basic ingredient and are sintered by thermal treatment, namely a so-called polycrystalline substance. The same is true for a ceramics that is processed after sintering. However, powder and slurry in which powder is dispersed are not included in the ceramics.

The "grains" in the present invention are so-called "nanograins", and mean grains having an average grain diameter of a nanometer to submicron size. Specifically, the average grain diameter is within the range of 1 nanometer (nm) or larger and 999 nm or smaller, or an average grain volume is within the range of 1 cubic nanometer ($nm^3$) or larger and $1 \times 10^9$ $nm^3$ or smaller. In particular, grains having an average grain diameter of 10 nm or larger and 500 nm or smaller, or an average grain volume of $1 \times 10^3$ $nm^3$ or larger and $1.25 \times 10^3$ $nm^3$ or smaller are suitable for embodying the present invention.

The bismuth iron oxide powder of the present invention contains the grains (A), the grains (B), and the grains (C). It is desired that the content of the grains (A) having a perovskite-type crystal structure be 51% or larger and 99.9% or smaller, more preferably 75% or larger and 95% or smaller of the total powder, in terms of quantitative ratio determined by x-ray diffraction. The reason is as follows. The dielectric performance or piezoelectric performance of the dielectric ceramics produced using the powder of the present invention is due to the grains (A). If other components are contained more, the density of the grains (A) is diluted so that sufficient performance cannot be obtained.

Note that, the "quantitative ratio" and the content ratio of grains in the present invention are expressed as a volume ratio. In an oxide in which all or some of the constituent elements are the same atomic number or similar atomic numbers, the volume ratio has substantially the same value as the atomic ratio. Therefore, the effect of the present invention can be obtained by using the same value as the atomic ratio instead of the volume ratio.

On the other hand, the grains (B) and the grains (C) are necessary for obtaining good insulation characteristics in the dielectric ceramics after sintering. The content of grains (B) is preferably 0.1% or larger and 49% or smaller, more preferably 1% or larger and 15% or smaller of the total powder in terms of quantitative ratio determined by the x-ray diffraction. The content of grains (C) is preferably 0.1% or larger and 49% or smaller, more preferably 1% or larger and 15% or smaller of the total powder in terms of quantitative ratio determined by the x-ray diffraction. Further, the sum of content ratios of the grains (B) and the grains (C) is preferably 0.1% or larger and 49% or smaller, more preferably 1% or larger and 25% or smaller of the total powder in terms of quantitative ratio determined by the x-ray diffraction.

The perovskite-type crystal structure of the present invention means one of the perovskite-type structures of the cubic structure, the tetragonal structure, the orthorhombic structure, and the rhombohedral structure, and is preferably the rhombohedral structure. It is desired that, as to the composition ratio of the bismuth iron oxide, bismuth, iron, and oxygen be contained at the atomic ratio of 1:1:3. The composition may be a composition in which a part of bismuth or iron is substituted by other element, or may be a composition in which a part of bismuth, iron, or oxygen is lacking, or is contained excessively.

The composition ratio described here does not include hydrogen, carbon, and nitrogen. The reason is as follows. Those elements are contained in moisture, carbon dioxide, and nitrogen in the air, or in organic gas or liquid to be contacted in the manufacturing process, and hence may be adsorbed on the grains. The same is true for the composition ratio described below.

Other ingredients contain at least two types of grains including the grains (B) having the crystal structure classified to the space group Pbam and the grains (C) having the crystal structure that is classified to the space group I23. Other grains than the two types of grains may exist, but it is desired that the other grains do not exist.

The space groups are groups in which three dimensional crystals are classified from a viewpoint of symmetry by the group theory. Each of the three dimensional crystals belongs to one of 230 space groups. As to expression of the space group used for description of the present invention, Short Hermann-Mauguin symbol described in INTERNATIONAL TABLES FOR CRYSTALLOGRAPHY by THE INTERNATIONAL UNION OF CRYSTALLOGRAPHY is adopted. Note that, the number of space group and the expression by the Schoenflies symbol are No. 55 and $D^9_{2h}$ respectively for the space group Pbam, and are No. 197 and $T^3$ respectively for the space group I23.

The grains (B) have a composition similar to $Bi_2Fe_4O_9$, but may have a composition in which a part of bismuth, iron, or oxygen is substituted by other element, or a composition in which a part of bismuth, iron, or oxygen is lacking, or is contained excessively.

The grains (C) have a composition similar to $Bi_{25}FeO_{39}$ or $Bi_2O_2$, but may have a composition in which a part of bismuth, iron, or oxygen is substituted by other element, or a composition in which a part of bismuth, iron, or oxygen is lacking, or is contained excessively. In addition, the grains (C) have a tendency of being needle-like grains. In this case, an example of the size of the grain (C) is a few ten to a few hundred nanometers in width, that is, diameter of the needle-like grain, and a few hundred nanometers to a few microns in length of the needle-like grain.

One of causes of the leakage current in ceramics containing $BiFeO_2$ as the main component is considered to be current that flows along the crystal grain boundary as the conduction path. When the powder of the present invention is sintered, the grains (A) as the main component lead to crystal growth so that $BiFeO_2$ crystal grains are generated. In this case, the grains (B) are pushed out to the grain boundary of the $BiFeO_2$ crystal grains so that $Bi_2Fe_4O_9$ crystals are generated at the grain boundary. It is known that $Bi_2Fe_4O_9$ has a lower crystal growth speed than $BiFeO_3$ in the temperature range of 500 degrees centigrade or higher and 900 degrees centigrade or lower. The crystals having lower crystal growth speed than $BiFeO_3$ grow slowly on the uppermost surface of the $BiFeO_3$ crystal grains in the growth process, and hence have a structure in the end in which the slowly growing crystal grains are deposited at the $BiFeO_3$ crystal grain boundary. In this case, because the grains (A) and the grains (B) are nanograins, the $Bi_2Fe_4O_9$ crystals are generated uniformly at the $BiFeO_3$ grain boundary. The $Bi_2Fe_4O_9$ crystal is a good insulator, and the $Bi_2Fe_4O_9$ crystals disposed uniformly along the grain boundary can suppress the leakage current along the $BiFeO_3$ crystal grain boundary as the conduction path. With this mechanism, it is considered that the insulation characteristics can be improved in the ceramics obtained by sintering the powder of the present invention. If one or both of the grains (A) and the grains (B) have a grain diameter of 1 micron or larger, $Bi_2Fe_4O_9$ crystals obtained by the sintering will be unevenly distributed, with the result that sufficient effect of suppressing the leakage current cannot be obtained.

In addition, one of other causes of the leakage current in the ceramics containing $BiFeO_3$ as the main component is considered as follows. When the composition of the $BiFeO_3$ crystal grains becomes a bismuth deficient composition, excessive oxygen generated by bismuth defect or bismuth deficiency in the $BiFeO_3$ crystal becomes a dopant so that holes are generated in the valence band (or electrons are generated in the conduction band), resulting in the current flowing in the crystal grains. When the powder of the present invention is sintered, the grains (A) as the main component lead to crystal growth so that the $BiFeO_3$ crystal grains are generated. In this case, bismuth in the $BiFeO_3$ crystal which is evaporated and becomes deficient by heat is compensated by bismuth existing a lot in the grains (C). Thus, the bismuth deficiency in the $BiFeO_3$ crystal can be prevented so that the current flowing in the $BiFeO_3$ crystal can be suppressed. In this case, because the grains (A) and the grains (C) are mixed homogeneously as nanograins, bismuth can be compensated uniformly so that occurrence of a local bismuth deficiency in the $BiFeO_3$ crystal can be prevented. If one or both of the grains (A) and the grains (C) have a grain diameter of micron or larger, $BiFeO_3$ crystals obtained by the sintering have a partial bismuth deficiency, with the result that sufficient effect of suppressing the leakage current cannot be obtained.

Next, a manufacturing method for the powder of the present invention is described. A manufacturing method for the bismuth iron oxide powder of the present invention includes the steps of adding ammonium hydrogen carbonate and ammonia water to a solution in which iron nitrate and bismuth nitrate are dissolved in a nitric acid solution, so as to obtain a bismuth iron composite oxide, agglomerating the bismuth iron composite oxide using a nonionic polymer flocculant so as to obtain an aggregate, and calcining the aggregate at a temperature of 400 degrees centigrade or higher and 650 degrees centigrade or lower.

The manufacturing method for the bismuth iron oxide powder according to the present invention is performed by a coprecipitation method. The "coprecipitation method" is a method of precipitating multiple types of refractory salts simultaneously in a solution containing two or more types of metallic ions so as to obtain a highly homogeneous powder.

The iron nitrate and the bismuth nitrate in the present invention are nitrates of trivalent iron and bismuth, respectively, which are expressed by formulas $Fe(NO_3)_3$ and $Bi(NO_3)_3$, respectively. The iron nitrate and the bismuth nitrate of amounts corresponding to the composition of the target bismuth iron oxide powder are dissolved in nitric acid, which is then mixed into a mixed solution of sodium hydrogen carbonate ($NaHCO_3$) and ammonia ($NH_3$). By stirring the solution, the bismuth iron composite oxide can be obtained. As to the iron nitrate and the bismuth nitrate, it is possible to use hydrates thereof. The sodium hydrogen carbonate ($NaHCO_3$) and the ammonia ($NH_3$) act as precipitant.

In this case, other compound, for example, a chloride, a sulfate, and an acetate cannot be used as the raw materials of the iron and bismuth. The reason is that if such raw materials are used, grains (grains (A)) having the perovskite-type crystal structure as the main component cannot be obtained.

The obtained bismuth iron composite oxide has a grain diameter of a nanometer size and is hardly collected from the solution by filtering. Therefore, a flocculant is added to the solution for agglomerating the obtained bismuth iron composite oxide so as to obtain the aggregate. As the flocculant, a nonionic polymer flocculant is used, which has its effect even in an alkaline solution. An example of the nonionic polymer flocculant includes SANFLOC N-520P (manufactured by Sanyo Chemical Industries, Ltd.).

The aggregate obtained in this way is an amorphous of bismuth iron composite oxide. By calcining this, the bismuth iron composite oxide is crystallized, and simultaneously the component of the nonionic polymer flocculant is eliminated so that the target bismuth iron oxide powder can be obtained.

The calcining temperature is preferably 400 degrees centigrade or higher and 650 degrees centigrade or lower. If the calcining temperature is lower than 400 degrees centigrade, the crystallization of bismuth iron oxide is not sufficient so that the grains (A), (B), and (C) are not generated. In addition, the elimination of polymer flocculant may be insufficient. On the contrary, if the calcination is performed at a temperature higher than 650 degrees centigrade, the crystallization proceeds excessively so that the grain diameters of the grains (A), (B), and (C) become too large. As a result, the insulating effect of the ceramics becomes insufficient.

The inventors of the present invention revealed from the experiment that the change in physical property of the bismuth iron composite oxide powder due to a different calcination temperature appeared in the optical property of the power as well as in the insulating property after the manufacture of a ceramics. A bismuth iron composite oxide powder that can produce a ceramics having a good insulating property has an optical band-gap energy higher by 0.1 to 0.4 electron volts (eV) than a conventional bismuth iron composite oxide powder and a bismuth iron composite oxide powder which is obtained at a high calcination temperature and has a large grain diameter. The increase in optical band-gap energy is probably considered to be related to the fact that the respective grains, in particular the grain (A), were generated as nanograins. Note that, it was impossible to obtain a bismuth iron composite oxide powder having a larger optical band-gap energy than the above, and hence the correlation between a bismuth iron composite oxide powder having a larger optical band-gap energy and its insulating property is unknown.

The bismuth iron composite oxide powder according to the present invention is fine as described above. Therefore, the powder can be calcined to obtain a dielectric ceramics in which leakage current is effectively suppressed. On the other hand, if a coarse powder having an average grain diameter of exceeding 1 micrometer is used to obtain a ceramics containing a bismuth iron composite oxide by calcination, impurities are likely to be retained at a grain boundary between crystal grains that form the ceramics because the powder is coarse, thereby forming a leakage path. Therefore, in both the cases of a bismuth iron composite oxide powder having a low insulating property and a bismuth iron composite oxide powder having a relatively high insulating property, an insulating property of a ceramics to be obtained by calcining the powder is limited to some extent. Therefore, in the bismuth iron composite oxide powder according to the present invention, it is desired that an average diameter of grains having the perovskite-type crystal structure be 10 nanometers or larger and 500 nanometers or smaller, and that the powder have an optical band-gap energy of 1.7 electron volts or higher and lower than 2.0 electron volts.

Next, the dielectric ceramics of the present invention is described. The dielectric ceramics of the present invention is a dielectric ceramics containing bismuth iron oxide crystals having a crystal structure classified to the space group Pbam and bismuth iron oxide crystals having the perovskite-type crystal structure, which are made of bismuth iron oxide, and the bismuth iron oxide crystals having the crystal structure classified to the space group Pbam are distributed at the grain boundary of crystal grains of the bismuth iron oxide crystals having the perovskite-type crystal structure.

The perovskite-type crystal structure means one of the perovskite-type structures of the cubic structure, the tetragonal structure, the orthorhombic structure, and the rhombohedral structure, and is preferably the rhombohedral structure. The crystal having the perovskite-type crystal structure is preferably $BiFeO_3$. The composition ratio of Bi:Fe:O in $BiFeO_3$ is preferably 1:1:3 in terms of atomic ratio, but some deficiency or excess is permitted. The deficiency or excess is preferably 1% or smaller in terms of atomic ratio. Otherwise, a part of Bi in $BiFeO_3$ may be substituted by other element, for example, a rare-earth element and barium (Ba), or a part of Fe may be substituted by other element, for example, a transition metallic element, a rare-earth element, indium (In), gallium (Ga), and aluminum (Al).

The crystal classified to the space group Pbam is preferably $Bi_2Fe_4O_9$. The composition ratio of Bi:Fe:O in $Bi_2Fe_4O_9$ is preferably 2:4:9, but some deficiency or excess is permitted. The deficiency or excess is preferably 1% or smaller in terms of atomic ratio. Otherwise, a part of Bi in $Bi_2Fe_4O_9$ may be substituted by other element, or a part of Fe may be substituted by other element.

The crystal having a crystal structure classified to the space group Pbam is a good insulator, and can cut off the leakage current along the grain boundary as the conduction path when being distributed along the grain boundary of crystal grains constituted of the crystals having the perovskite-type crystal structure. As a result, the leakage current in the dielectric ceramics can be suppressed.

The dielectric ceramics of the present invention can be obtained by calcining the powder of the present invention, or a mixture of the powder of the present invention and powder of other ingredients. The powder of other ingredients is, for example, $BaTiO_3$, (Ba, Na)$TiO_3$, (Ba, K)$TiO_3$, and (K, Na)$NbO_3$.

The calcining temperature is 500 degrees centigrade or higher and 900 degrees centigrade or lower, preferably 600 degrees centigrade or higher and 800 degrees centigrade or lower. If the calcining temperature is lower than 500 degrees centigrade, the crystallization of the crystals having the perovskite-type crystal structure of the main component becomes insufficient. If the calcining temperature is higher than 900 degrees centigrade, the crystals having the perovskite-type crystal structure of the main component are decomposed, and the content of the main component is decreased, with the result that the target performance cannot be obtained.

The dielectric ceramics of the present invention may be manufactured using a manufacturing method other than the method involving calcining the powder of the present invention. As the manufacturing method other than the method involving calcining the powder of the present invention, for example, there is a method involving calcining a bismuth iron oxide powder obtained by a sol-gel method using an organic bismuth compound and an organic iron compound.

Next, the piezoelectric element of the present invention is described. The piezoelectric element of the present invention is a piezoelectric element including at least a pair of electrodes, and the dielectric ceramics described above. The dielectric ceramics is piezoelectric ceramics.

Figure 1:
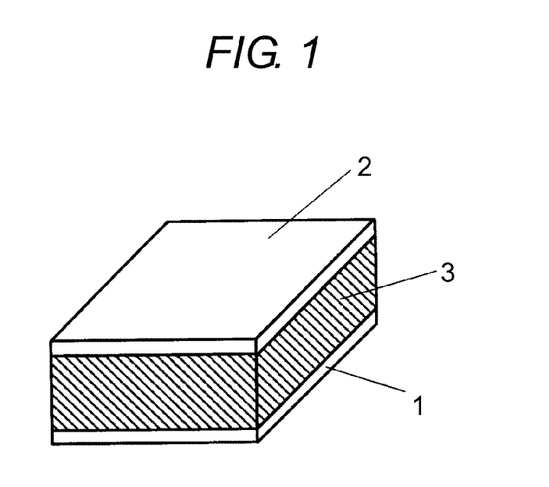
FIG. 1 is a schematic diagram illustrating an embodiment of a piezoelectric element according to the present invention.

FIG. 1 is a schematic diagram illustrating an example of the piezoelectric element using the dielectric ceramics of the present invention. The piezoelectric element of the present invention has a structure in which a dielectric ceramics 3 is sandwiched between a first electrode 1 and a second electrode 2. The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, and Ag and oxides of these metals. Each of the first electrode and the second electrode may be formed of one kind of those materials, or may be obtained by laminating two or more kinds thereof. The first electrode and the second electrode may be formed of different materials.

The method of forming the first electrode and the second electrode is not limited. The first electrode and the second electrode may be formed by baking metal paste, by sputtering, and by vapor deposition. In addition, both the first electrode and the second electrode may be patterned in desired shapes for use.

Figure 2A:
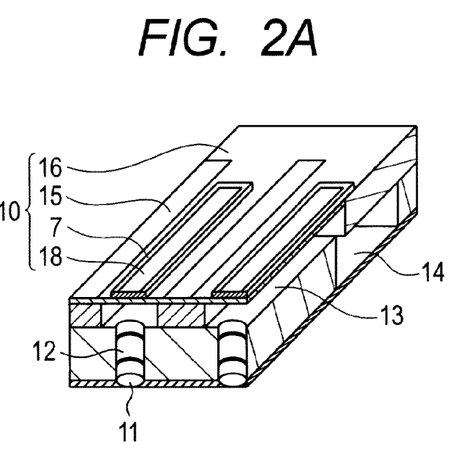
FIG. 2A is a schematic diagram illustrating an embodiment of a structure of a liquid discharge head according to the present invention.
Figure 2B:
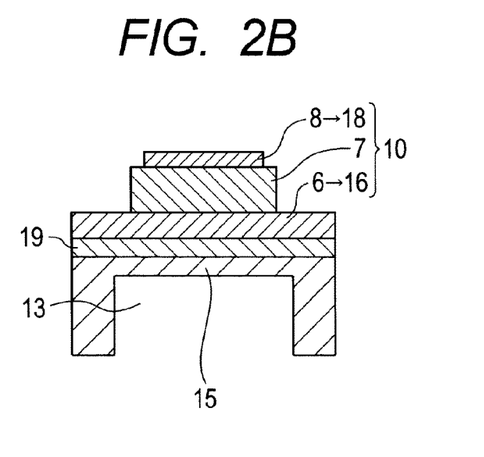
FIG. 2B is a cross sectional view of a piezoelectric element of the liquid discharge head of FIG. 2A in a width direction.

FIGS. 2A and 2B are each a schematic view illustrating an embodiment of a structure of a liquid discharge head of the present invention. As illustrated in FIG. 2B, the piezoelectric element of the present invention is a piezoelectric element including at least a first electrode 6, a piezoelectric ceramics 7, and a second electrode 8.

The liquid discharge head of the present invention is a liquid discharge head including the piezoelectric element. FIG. 2A is a schematic diagram of the liquid discharge head. The liquid discharge head includes a discharge port 11, a communicating hole 12 for connecting an individual liquid chamber 13 and the discharge port 11, a common liquid chamber 14, a diaphragm 15, and a piezoelectric element 10. The piezoelectric elements 10 has a rectangular shape as illustrated in FIG. 2A, but the shape may be other than the rectangular shape, namely an elliptical shape, a circular shape, a parallelogram shape, or the like. In that case, the piezoelectric ceramics 7 also has a shape corresponding to the individual liquid chamber in general.

The piezoelectric element 10 constituting the liquid discharge head of the present invention and its vicinity are described in more detail with reference to FIG. 2B. FIG. 2B is a cross sectional view of the piezoelectric element of the liquid discharge head illustrated in FIG. 2A in the width direction. The cross sectional shape of the piezoelectric element 10 is a rectangular in the diagram, but it may be a trapezoid or an inverse trapezoid. In addition, the first electrode 6 corresponds to a lower electrode 16 while the second electrode 8 corresponds to an upper electrode 18 in the diagram, but any one of the first electrode 6 and the second electrode 8 constituting the piezoelectric element 10 of the present invention may be the lower electrode 16 or the upper electrode 18. In addition, there may be a buffer layer 19 between the diaphragm 15 and the lower electrode 16.

In the liquid discharge head, the diaphragm moves up and down when the piezoelectric thin film is expanded and contracted, to thereby apply a pressure to liquid in the individual liquid chamber. Thus, the liquid is discharged from the discharge ports. The head of the present invention can be used in a printer application and manufacturing of an electronic device.

The diaphragm has a thickness of 1.0 µm or more and 15 µm or less, and preferably 1.5 µm or more and 8 µm or less. A material for the diaphragm, which is not limited, is preferably Si. In addition, the buffer layer and the electrode layer on Si may also serve as part of the diaphragm. Si for the diaphragm may be doped with B and P.

The buffer layer has a thickness of 300 nm or less, and preferably 200 nm or less. The size of the discharge port is 5 µm or more and 40 µm or less in diameter. The shape of the discharge port is a circular shape, but may be a star shape, a square shape, or a triangular shape.

Figure 3A:
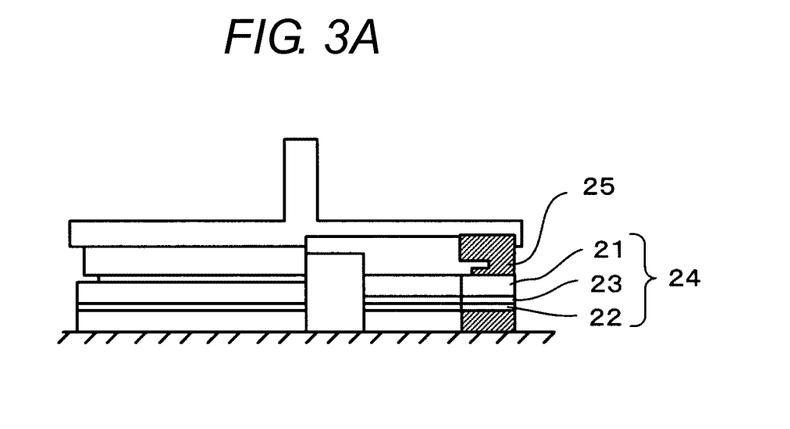
FIG. 3A is a schematic diagram illustrating an embodiment of a structure of an ultrasonic motor having the piezoelectric element of the present invention that is formed of a single plate.
Figure 3B:
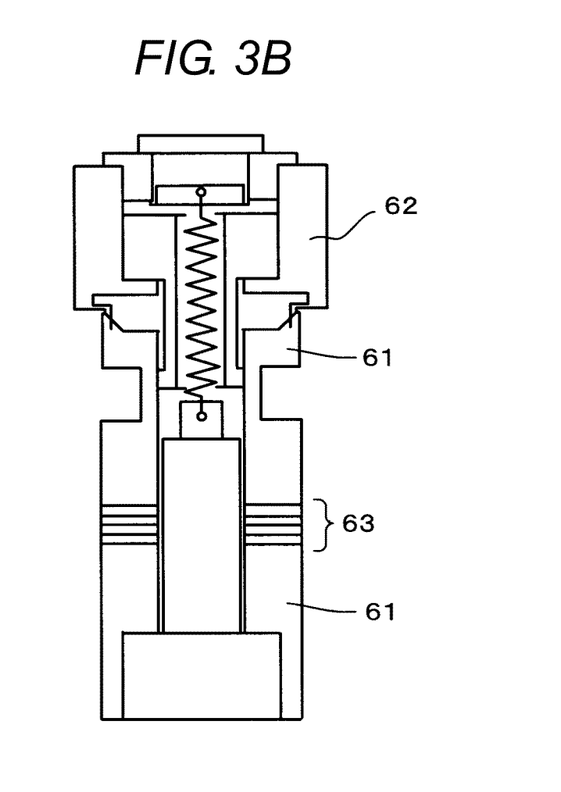
FIG. 3B is a schematic diagram illustrating an embodiment of a structure of the ultrasonic motor having the piezoelectric element of the present invention that has a laminate structure.

Next, an ultrasonic motor using the piezoelectric element according to the present invention is described. FIGS. 3A and 3B are schematic views illustrating an embodiment of a structure of the ultrasonic motor according to the present invention. FIG. 3A illustrates the ultrasonic motor formed of the single piezoelectric element of the present invention. The ultrasonic motor includes a vibrator 24 in which the piezoelectric element 22 of the present invention is adhered to an elastic metal ring 21 with an organic adhesive 23 (such as epoxy or cyanoacrylate adhesive), a rotor 25 contacting with a sliding surface of the vibrator 24 by being pressed by a pressure spring (not shown), and an output shaft that is integrally provided to the rotor 25.

The application of two alternating voltages (different from each other in phase by $\pi/2$) from a power source to the piezoelectric element of the present invention results in the generation of a bending travelling wave in the vibrator 24, and hence each point on the sliding surface of the vibrator 24 undergoes an elliptical motion. When the rotor 25 is brought into press contact with the sliding surface of the vibrator 24, the rotor 25 receives a frictional force from the vibrator 24 to rotate in the direction of the elliptical motion on the sliding surface of the vibrator. A body to be driven (not shown) is joined to the output shaft by, for example, a coupling and is driven by receiving the rotary force of the rotor 25. This type of motor utilizes the principle as follows. When a voltage is applied to the piezoelectric ceramics, the piezoelectric element is expanded and contracted by the piezoelectric lateral effect. Therefore, when the piezoelectric element is adhered to an elastic body of a metal or the like, the elastic body is warped.

In addition, with reference to FIG. 3B, an ultrasonic motor is exemplified in which the piezoelectric element has a laminate structure. In FIG. 3B, the ultrasonic motor includes a vibrator 61 made of a metallic material. Multiple piezoelectric elements 63 of the present invention are disposed between cylindrical metal blocks, and the metal blocks are fastened with bolts. Thus, the multiple piezoelectric elements 63 are sandwiched and fixed to constitute the vibrator. When AC voltages having different phases are applied to the piezoelectric body for driving the piezoelectric elements, two orthogonal vibrations are excited and combined to form a circular vibration for driving at the tip portion of the vibrator. Note that, a constricted circumferential groove is formed at the upper portion of the vibrator 61 so as to increase the displacement vibration for driving.

A rotor 62 is pressed by a pressing spring S to be brought into contact with the vibrator 61, and thus is obtained a frictional force for driving. As described above, the piezoelectric element of the present invention is suitably applicable to a liquid discharge head and an ultrasonic motor. As to the liquid discharge head, it is possible to provide a head having the nozzle density and the discharging force that are the same as or larger than those of the conventional head using a piezoelectric element containing lead. In addition, as to the ultrasonic motor, by using the lead-free piezoelectric element containing bismuth iron oxide as the main component, it is possible to provide a motor having the driving force and durability that are the same as or larger than those of the conventional motor using a piezoelectric element containing lead. The liquid discharge head and the ultrasonic motor have an advantage in that a load on environment is small, because they do not contain lead.

The piezoelectric ceramics of the present invention can be used for a liquid discharge head, a motor, and other devices such as an ultrasonic vibrator, a piezoelectric actuator, and a piezoelectric sensor.

EXAMPLES

Hereinafter, the present invention is described in more detail with reference to Examples. However, the present invention is not limited to the following Examples.

Example 1

Example of Manufacturing Bismuth Iron Oxide Powder

Commercial iron nitrate (III) 9-hydrate (Fe $(NO_3)_3 \cdot 9H_2O$) and bismuth nitrate (III) 5-hydrate ($Bi(NO_3)_3 \cdot 5H_2O$) were weighed at a ratio of 1:1 as the molar ratio and were mixed after adding deionized water. In this occasion, the bismuth nitrate (III) 5-hydrate may not be completely dissolved in water. In that case, an appropriate amount of concentrated nitric acid was added and stirred at a liquid temperature of 25 degrees centigrade so that the bismuth nitrate (III) 5-hydrate was dissolved completely. Thus, the bismuth iron solution was obtained. In view of the manufacturing amount and workability, the amounts of individual raw material compounds of bismuth and iron, as well as the amounts of concentrated nitric acid and deionized water were determined as required so that the bismuth iron oxide powder was manufactured. An example of a combination ratio thereof is as follows. The amounts of individual raw material compounds of bismuth and iron, and the amounts of concentrated nitric acid and deionized water were adjusted so that the concentrations of bismuth and iron in the solution become 15 to 20 percent by weight of the total solution in a conversion into $BiFeO_3$, and that the nitric acid concentration becomes a value which can completely dissolve the bismuth nitrate (III) 5-hydrate. A more specific example of the combination ratio was as follows in weight ratio.

| iron nitrate (III) 9-hydrate | 1.0 |
| --- | --- |
| bismuth nitrate (III) 5-hydrate | 1.2 |
| nitric acid (60% nitric acid) | 0.38 |
| deionized water (ion-exchanged water) | 1.5 |

On the other hand, a solution in which commercial ammonia ($NH_3$) solution, sodium hydrogen carbonate ($NaHCO_3$), and deionized water ($H_2O$) were mixed was produced as mother liquid for precipitation. The combination ratio of ammonia to sodium hydrogen carbonate was approximately one or smaller as the molar ratio, and the amount of the added deionized water was set to be a little larger than the minimum amount such that ammonium hydrogen carbonate was dissolved. As the total amount of the mother liquid for precipitation, a few times the amount of bismuth iron solution in weight ratio was produced. As an example of a specific amount of the mother liquid for precipitation, 8 to 10 times the amount of bismuth iron solution in weight ratio was produced. A more specific combination ratio was as follows in weight ratio.

| ammonium hydrogen carbonate | 1.2 |
| --- | --- |
| 28% ammonia water | 0.90 |
| deionized water (ion-exchanged water) | 29 to 37 |

At room temperature, the bismuth iron solution was dropped into the mother liquid for precipitation, and the bismuth iron solution and the mother liquid for precipitation were stirred. Then, solid nanograins were generated in the liquid. Under a state in which the generated solid nanograins were dispersed in the liquid, a nonionic polymer flocculant (SANFLOC N-520P manufactured by Sanyo Chemical Industries, Ltd.) was added as a precipitant to the liquid, and thus the generated solid nanograins were precipitated. The adding amount of the nonionic polymer flocculant is only required to be approximately one tenth to one thousandth the amount of bismuth iron solution in weight ratio. As an example, the amount was one hundredth. After that, the precipitated solid body was filtered and collected by quantitative filter paper.

Figure 4:
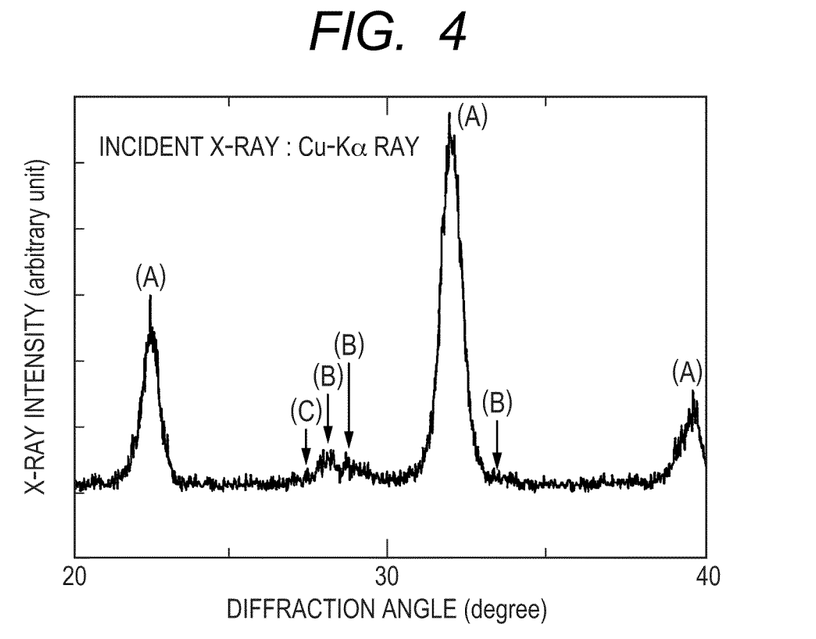
FIG. 4 is a graph illustrating an x-ray diffraction pattern of a bismuth iron oxide powder according to Example 1 of the present invention.

The obtained solid body was calcined in a box type electric furnace at a temperature of 550 degrees centigrade for one hour. As a result, a brown or ocher nanograin powder was obtained. The average grain diameter of the powder was 200 nm. A part of the x-ray diffraction pattern obtained by x-ray diffraction measurement of the powder is illustrated in FIG. 4. The obtained x-ray diffraction pattern can be well explained by assuming the main component of the powder to have the same crystal structure as $BiFeO_3$. Therefore, it was found that the powder was a substance having the rhombohedral perovskite-type structure. In addition, it was confirmed that the powder contained a second and a third phases other than the main component. The second phase could be well explained by the same crystal structure as $Bi_2Fe_4O_9$. Therefore, it was found that the grains have a crystal structure classified to the space group Pbam. The third phase could be well explained by the same crystal structure as $Bi_{25}FeO_{39}$. Therefore, it was found that the grains have a crystal structure classified to the space group I23. The volume ratios of the individual substances calculated by the result of the x-ray diffraction measurement were as follows. The second phase was 12% of the whole, the third phase was 3% of the whole, and the rest was a substance having a perovskite-type structure of the main component and was 85% of the whole.

Figure 5:
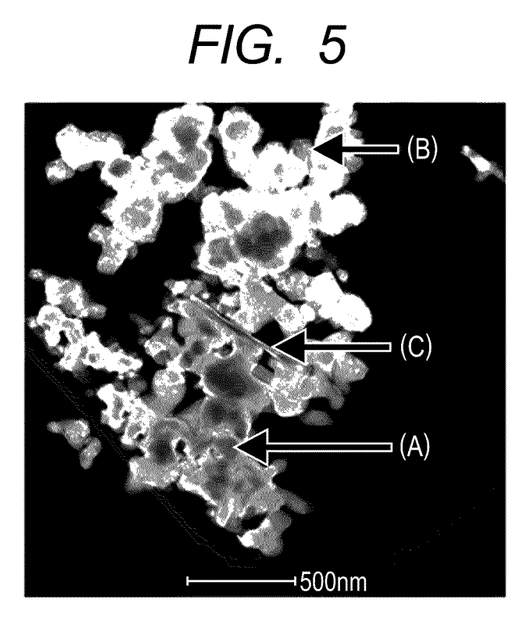
FIG. 5 is a transmission electron microscope photograph of the bismuth iron oxide powder according to Example 1 of the present invention.

An observation photograph of the bismuth iron oxide powder taken by a transmission electron microscope (TEM) is shown in FIG. 5. According to this photograph, it was found that this powder was constituted of three different shapes of grains. Electron beam diffraction was measured of the grains having a relatively isotropic shape similar to a spherical shape and a smooth surface, which are represented by grains (A) indicated by an arrow in the photograph. The figure of the grains (A) could be explained by assuming the same crystal structure as $BiFeO_3$. Therefore, it was found that the grains (A) were constituted of crystals having the rhombohedral perovskite-type structure.

Electron beam diffraction was measured of the grains having a relatively isotropic shape similar to a spherical shape and an uneven surface structure, which are represented by grains (B) indicated by an arrow in the photograph. The figure of the grain (B) could be explained by assuming the same crystal structure as $Bi_2Fe_4O_9$. Therefore, it was found that the grains (B) were constituted of crystals having a crystal structure classified to the space group Pbam.

Electron beam diffraction was measured of the grains having a needle-like shape, which are represented by grains (C) indicated by an arrow in the photograph. The figure of the grains (C) could be explained by assuming the same crystal structure as $Bi_{25}FeO_{39}$ or $\gamma$-$Bi_2O_3$. Therefore, it was found that the grains (C) were constituted of crystals having a crystal structure classified to the space group I23. Fe was not detected from an EDX measurement result of the grains (C). The reason is considered to be that the content ratio of Fe is too small to be detected by EDX, or that Fe is not contained essentially.

Comparative Example 1

Example of Manufacturing Bismuth Iron Oxide Powder

A precipitate of bismuth iron composite oxide compound nanograins was produced and collected using commercial iron chloride ($FeCl_3$) and bismuth chloride ($BiCl_3$) in the same method.

The obtained precipitate and a powder obtained by sintering the precipitate in a box type electric furnace at a temperature of 800 degrees centigrade were analyzed by x-ray diffraction, and it was found that the powder was constituted of crystals having a different crystal structure from each the above-mentioned grains (A), (B), and (C). In addition, it was found that each of a bismuth iron oxide powder produced using commercial iron acetate and bismuth acetate and a bismuth iron oxide powder produced using commercial iron sulfate and bismuth sulfate was powder constituted of crystals having a different crystal structure from each of the above-mentioned grains (A), (B), and (C).

Example 2

Example of Manufacturing Dielectric Ceramics Constituted of Bismuth Iron Oxide

A dielectric ceramics constituted of bismuth iron oxide was manufactured using the bismuth iron oxide powder obtained in Example 1 by the following method.

Ethanol solution containing 3 percent by weight of polyvinyl butyral (PVB) was added to the powder of Example 1, and they were mixed well and dried. The solid body after being dried was crushed to be powder, and the powder was filled in a pelletizing machine and pressed by a hydraulic press machine so that pellets of the powder of Example 1 were obtained. The pellets were sintered in a box type electric furnace at a temperature of 800 degrees centigrade for 2 hours, and a dielectric ceramics disc constituted of bismuth iron oxide was obtained.

The top surface and the bottom surface of the obtained dielectric ceramics disc were ground and polished, and thin film of titanium having a thickness of 5 nm was formed on each polished surface by RF magnetron sputtering method, on which thin film of gold having a thickness of 300 nm was formed to make opposed electrodes. Using a dicing saw, cutting process was performed in the direction orthogonal to the opposed electrodes, so as to obtain a dielectric element including electrodes on the two opposite surfaces. The values of an electric resistance, a relative dielectric constant, and a dielectric loss (tan $\delta$) of the element of Example 2 in that case when 10 V was applied are shown in Table 1.

Comparative Example 2

Example of Manufacturing Dielectric Ceramics Constituted of Bismuth Iron Oxide

As a comparison with the dielectric ceramics of Example 2 constituted of bismuth iron oxide, a dielectric ceramics constituted of bismuth iron oxide using commercial $Bi_2O_3$ reagent powder (having an average grain diameter of 20 micrometers) and $Fe_2O_3$ reagent powder (having an average grain diameter of 500 nanometers) as raw materials was produced. $Bi_2O_3$ and $Fe_2O_3$ of a molar ratio of 1:1 were crushed and mixed in an agate mortar, and the mixed powder was preliminarily calcined in a box type electric furnace at a temperature of 800 degrees centigrade for 15 minutes, and the preliminarily calcined material was crushed and mixed in an agate mortar, and then a preliminarily calcined powder was obtained.

Ethanol solution containing 3 percent by weight of PVB was added to the preliminarily calcined powder, and they were mixed well and dried. After that, the same process as in Example 2 was performed so that a dielectric ceramics disc constituted of bismuth iron oxide was obtained. In addition, the same process as in Example 2 was performed so that a dielectric element including electrodes on the two opposite surfaces was obtained. The values of an electric resistance in that case when 10 V was applied, a relative dielectric constant, and tan $\delta$ of the element of Comparative Example 2 are shown in Table 1.

The measurement of the electric resistance was performed using a semiconductor parameter analyzer (manufactured by Agilent Technologies, Inc.). The measurement of the relative dielectric constant and the measurement of the tan $\delta$ were performed using an impedance analyzer (manufactured by Agilent Technologies, Inc.).

TABLE 1

| | Electric resistance | Relative Dielectric Constant | tan$\delta$ |
|---|---|---|---|
| Example 2 | 120 G$\Omega$cm | 160 | 0.025 |
| Comparative Example 2 | 220 k$\Omega$cm | 3,100 | 0.71 |

As shown in Table 1, in the dielectric element of Example 2, it was confirmed that the resistance value was improved by six digits compared with the element of Comparative Example 2. This indicates that the leakage current value is reduced by six orders of magnitude. The value of the relative dielectric constant in Comparative Example 2 indicates a large value because the capacitance value was over estimated due to the large leakage current in the capacitance evaluation by the impedance analyzer. Therefore, this large value of the dielectric constant does not mean that the dielectric characteristics have been improved.

In order to check a mechanism of the leakage current reduction effect, cross sectional TEM observation of each element was performed. The element of Example 2 and the dielectric element of Comparative Example 2 were cut in the direction perpendicular to the electrode, and the cut sections were observed by TEM. Results of the cross section observation photographs are shown in FIGS. 6 and 7.

Figure 6:
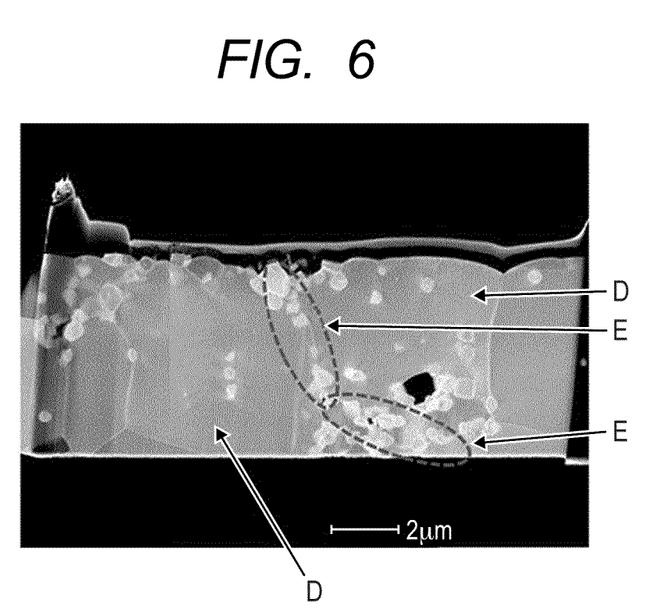
FIG. 6 is a transmission electron microscope photograph of a cross section of a dielectric ceramics according to Example 2 of the present invention.
Figure 7:
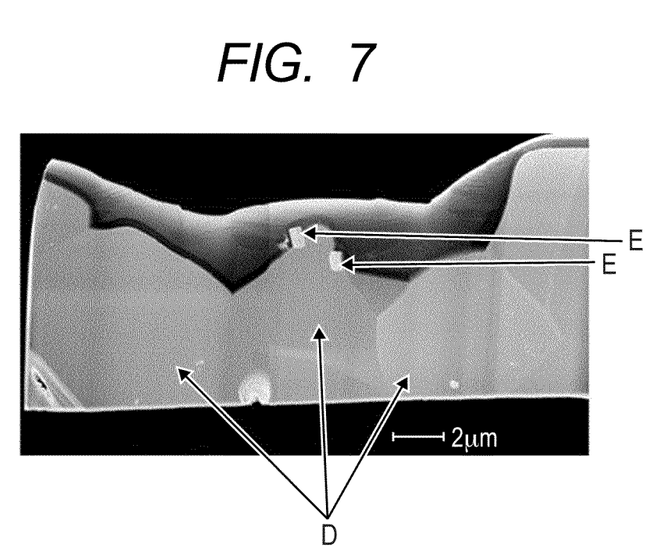
FIG. 7 is a transmission electron microscope photograph of a cross section of a dielectric ceramics according to Comparative Example 2 of the present invention.

It was found from electron beam diffraction that grains as a main constituent of the dielectric ceramics in Example 2 are constituted of rhombohedral crystals having the perovskite-type crystal structure (indicated by D in FIG. 6). The grains are identified to be $BiFeO_3$. In addition, it was observed from FIG. 6 that rectangular grains were uniformly deposited at the grain boundary of the $BiFeO_3$ crystal grains (as indicated by E in FIG. 6). It was found from the electron beam diffraction measurement that the grains are grains having a crystal structure classified to the space group Pbam. This grain was identified to be $Bi_2Fe_4O_9$. $Bi_2Fe_4O_9$ is a good insulator. When $Bi_2Fe_4O_9$ is distributed along the grain boundary of $BiFeO_3$ crystal grains, it is considered to cut off leakage current along the grain boundary as the conduction path so that leakage current in the dielectric ceramics can be suppressed. Further, bismuth in the BiFeO₃ crystal grains which is evaporated and becomes deficient by heat in the sintering process is compensated by bismuth existing a lot in the grains (C). Thus, it is considered that the bismuth deficiency in the BiFeO₃ crystal was prevented, and the current flowing in the BiFeO₃ crystal could be suppressed.

Similarly, it was found that grains as a main constituent of the dielectric ceramics in Comparative Example 2 was constituted of rhombohedral crystals having the perovskite-type crystal structure (indicated by D in FIG. 7), which was identified to be BiFeO₃. However, unlike the dielectric ceramics in Example 2, grains having a crystal structure that is classified to a space group Pbam (indicated by E in FIG. 7) scarcely exist at the grain boundary of the BiFeO₃ crystal grains. Therefore, it is considered that the leakage current along the grain boundary as the conduction path could not be cut off, and thus a value of a low electric resistance, namely a large leakage current value was observed.

(Evaluation of Optical Property)

Figure 8:
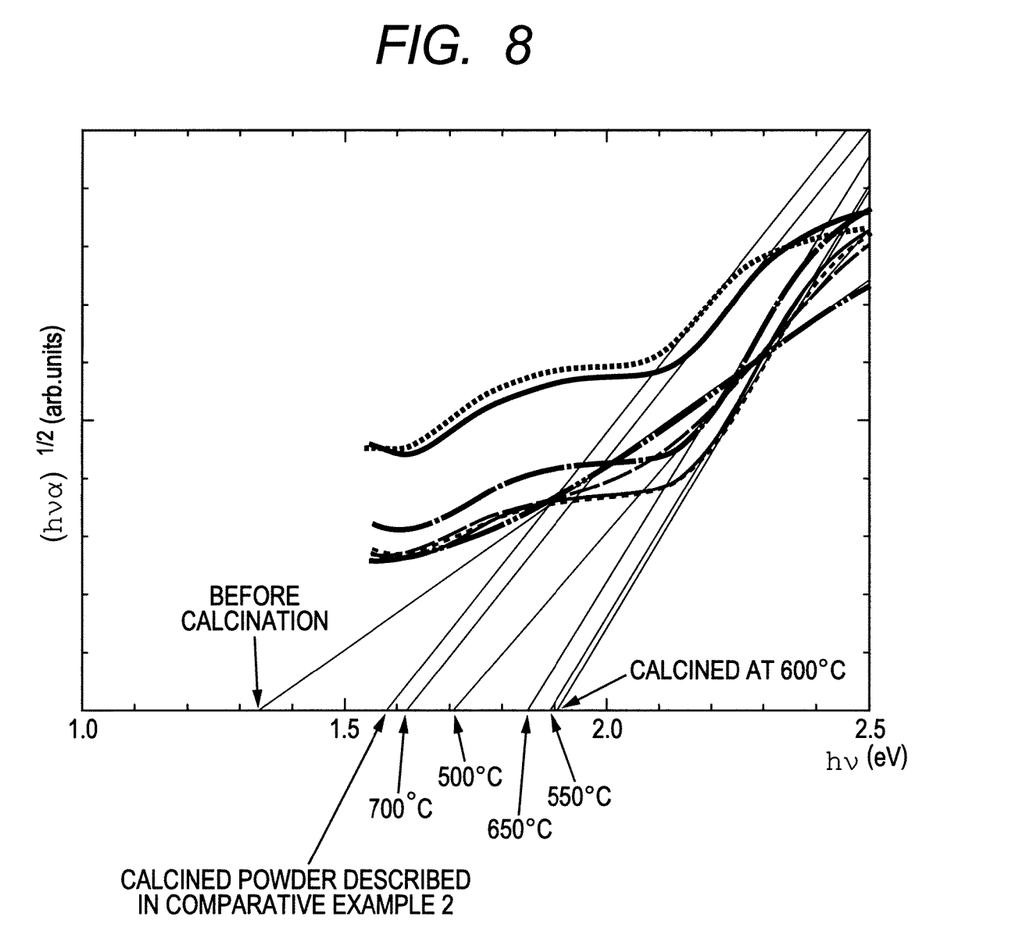
FIG. 8 is a graph illustrating optical properties of the bismuth iron oxide powders according to Example 1 and Comparative Example 3 of the present invention.

Optical absorbance was measured of the bismuth iron oxide powder produced in Example 1 and each of the bismuth iron oxide powders obtained by the process of Example 1 at the calcination temperatures of 500 degrees centigrade, 600 degrees centigrade, and 650 degrees centigrade. The measurement was performed on a sample of the powder placed in the Integrating sphere by a diffuse reflection method using an ultraviolet-visible (UV-Vis) spectrometer in the wavelength range of 350 nanometers to 800 nanometers. In the measurement, a diffuse reflection spectrum was measured of barium sulfate as a standard sample, and a relative reflectance of each substance was determined. The obtained relative reflectance was converted into an absorbance. Because the absorbance is proportional to an optical absorbance coefficient ($\alpha$), the Tauc plot was used to determine an optical band-gap energy. The Tauc plot is obtained by plotting the h$\nu$-dependency of $\alpha$ according to the following expression, with h$\nu$ as photon energy corresponding to each wavelength.

$$h\nu = k(h\nu\alpha)^n$$

where k is a coefficient, and n is an index that mainly takes 2 or ½ depending on a band structure of a substance. In general, n=½ is used for an amorphous substance or a nanoparticle, and hence our evaluation by the Tauc plot also employed n=½. In the plot, a segment that exhibits the largest change in $(h\nu\alpha)^{1/2}$ in the ordinate was approximated by a straight line, and a value of the h$\nu$-intercept in the abscissa obtained by extrapolating the straight line to $(h\nu\alpha)^{1/2}=0$ was determined as the optical band-gap energy. FIG. 8 illustrates the Tauc plot of the above-mentioned bismuth iron oxide powders. It was found that each of the optical band-gap energies of the bismuth iron oxide thin films obtained by the calcination temperatures of 500 degrees centigrade, 550 degrees centigrade, 600 degrees centigrade, and 650 degrees centigrade was between 1.7 eV and 2.0 eV.

Comparative Example 3

Diffuse reflection spectrum measurement was performed on the bismuth iron oxide powder which was obtained at the calcination temperature of 700 degrees centigrade in the process of Example 1, a bismuth iron oxide powder which was obtained by the process of Example 1 excluding the calcining process, and the preliminarily calcined powder which was obtained in Comparative Example 2 before sintering the ceramics. Results of the measurement are illustrated in FIG. 8 as the Tauc plot. The preliminarily calcined powder of Comparative Example 2 was evaluated to have an optical band-gap energy of approximately 1.6 eV. Similarly, the bismuth iron oxide powder obtained at the calcination temperature of 700 degrees centigrade had also an optical band-gap energy of approximately 1.6 eV. The reason is considered that the crystal grains were enlarged because the calcination temperature was too high. The bismuth iron oxide powder obtained by excluding the calcining process of Example 1 was evaluated to have an optical band-gap energy of approximately 1.3 eV. This powder is known to be amorphous by the x-ray diffraction measurement, and hence such low optical band-gap energy is considered to result from non-crystallization.

Example 3

Evaluation of Piezoelectric Property

Polarization process of the dielectric element including electrodes on the two opposite surfaces of a rectangular used in Example 2 was performed in silicone oil. The oil temperature was 120 degrees centigrade, polarization electric field was DC 60 kV/cm, and electric field application time period was 60 minutes. This dielectric element had good electric field strength because of the low leakage current value, and hence the polarization process could be performed sufficiently. On the other hand, when the same polarization process was performed on the dielectric element used in Comparative Example 2, current exceeding an allowable current value flowed soon after the application of electric field. Therefore, the polarization process could not be completed.

The dielectric element of Example 2 on which the polarization process had been performed was evaluated using $d_{33}$ piezoelectric constant measuring apparatus (Piezo Meter System manufactured by Piezotest Pte. Ltd.). The obtained piezoelectric constant was good.

Example 4

Trial Manufacture of Liquid Discharge Head and Ultrasonic Motor

The liquid discharge head and the ultrasonic motor illustrated in FIGS. 2A to 3B are manufactured as trial using the dielectric ceramics illustrated in Example 2. As to the liquid discharge head, it was confirmed that ink was discharged in response to an input electric signal. As to the ultrasonic motor, it was confirmed that the motor rotated in response to application of an alternating voltage. The bismuth iron oxide powder of the present invention can be used for manufacturing a dielectric ceramics having a small load on environment and good dielectric characteristics and piezoelectric characteristics.

The dielectric ceramics of the present invention have a small load on environment and good dielectric characteristics, and hence it is possible to be used for equipment such as a piezoelectric element, a liquid discharge head, or an ultrasonic motor, without any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A bismuth iron oxide powder comprising:
   (A) grains including a bismuth iron oxide having a perovskite-type crystal structure;
   (B) grains including a bismuth iron oxide having a crystal structure classified to a space group Pbam represented by a Short Hermann-Mauguin symbol; and
   (C) grains including a bismuth iron oxide or a bismuth oxide having a crystal structure that is classified to a space group I23 represented by a Short Hermann-Mauguin symbol,
   wherein content of the grains (A) is 51% or larger and 99.9% or smaller of a total of the bismuth iron oxide powder at a quantitative ratio determined by x-ray diffraction, and
   wherein a sum of content ratios of the grains (B) and the grains (C) is 0.1% or larger and 49% or smaller of the total of the bismuth iron oxide powder at a quantitative ratio determined by x-ray diffraction.

2. The bismuth iron oxide powder according to claim 1, wherein the bismuth iron oxide powder has an optical bandgap energy of 1.7 electron volts or higher and lower than 2.0 electron volts.

3. A dielectric ceramics comprising a dielectric ceramic material,
   wherein the dielectric ceramic material comprises bismuth iron oxide crystal grains (B) having a crystal structure classified to a space group Pbam represented by a Short Hermann-Mauguin symbol and bismuth iron oxide crystal grains (A) having a perovskite-type crystal structure, which are made of bismuth iron oxide,
   wherein the bismuth iron oxide crystal grains (B) having the crystal structure classified to the space group Pbam represented by the Short Hermann-Mauguin symbol are distributed at a grain boundary of crystal grains of the bismuth iron oxide crystal grains (A) having the perovskite-type crystal structure,
   wherein the bismuth iron oxide crystal grains (A) having the perovskite-type crystal structure comprise $BiFeO_3$,
   wherein the bismuth iron oxide crystal grains (B) having the crystal structure classified to the space group Pbam represented by the Short Hermann-Mauguin symbol comprise $Bi_2Fe_4O_9$,
   wherein the grain boundary is present between $BiFeO_3$, and
   wherein $Bi_2Fe_4O_9$ is distributed along the grain boundary.

4. A piezoelectric element comprising at least a pair of electrodes, and the dielectric ceramics according to claim 3.

5. A liquid discharge head comprising the piezoelectric element according to claim 4.

6. An ultrasonic motor comprising the piezoelectric element according to claim 4.

7. The dielectric ceramics according to claim 3, wherein the dielectric ceramic material is obtained by a method comprising calcining a bismuth iron oxide powder, wherein the bismuth iron oxide powder comprises:
   (A) grains including a bismuth iron oxide having a perovskite-type crystal structure;
   (B) grains including a bismuth iron oxide having a crystal structure classified to a space group Pbam represented by a Short Hermann-Mauguin symbol; and
   (C) grains including a bismuth iron oxide or a bismuth oxide having a crystal structure that is classified to a space group I23 represented by a Short Hermann-Mauguin symbol,
   wherein content of the grains (A) is 51% or larger and 99.9% or smaller of a total of the bismuth iron oxide powder at a quantitative ratio determined by x-ray diffraction, and
   wherein a sum of content ratios of the grains (B) and the grains (C) is 0.1% or larger and 49% or smaller of the total of the bismuth iron oxide powder at a quantitative ratio determined by x-ray diffraction.

* * * * *